United States Patent [19]

Kinder

[11] 4,054,795
[45] Oct. 18, 1977

[54] PHOTOELECTRIC SENSING SYSTEM WITH LIGHT SOURCE COMPENSATING MEANS

[75] Inventor: George William Kinder, Columbus, Ohio

[73] Assignee: Bell Telephone Laboratories, Incorporated, Murray Hill, N.J.

[21] Appl. No.: 641,274

[22] Filed: Dec. 16, 1975

[51] Int. Cl.² ............................................. G01J 1/32
[52] U.S. Cl. .................................. 250/205; 250/552; 250/214 AG
[58] Field of Search ........ 250/205, 552, 551, 214 AG, 250/209

[56] References Cited

U.S. PATENT DOCUMENTS 3,742,222  6/1973  Endl ........................................ 250/209
3,819,947  6/1974  Johnson et al. ....................... 250/552

OTHER PUBLICATIONS

Thomas, Jr. and Tyndall, Jr. "Digital Feedback Light--Emitting Diode Control" IBM Technical Disclosure Bulletin, vol. 16, No. 8, Jan. 1974.

Primary Examiner—Alfred E. Smith
Assistant Examiner—David K. Moore
Attorney, Agent, or Firm—Dwight A. Marshall

[57] ABSTRACT

A photoelectric sensing system for detecting the occurrence of interruptions of a light beam is arranged to compensate for non-interrupting short-term variations occurring during transmission of the light beam. A clock controlled memory element enables a light emitting generator to generate a serial train of light pulse signals. Each generated light pulse signal is sensed by a sensor arranged to control the memory element to modulate the emitted light pulse signal to compensate for short-term variations occurring in the light signal transmission path.

9 Claims, 2 Drawing Figures

PHOTOELECTRIC SENSING SYSTEM WITH LIGHT SOURCE COMPENSATING MEANS

BACKGROUND OF THE INVENTION

This invention relates to a photoelectric sensing system. In particular, it relates to a photoelectric system arranged to detect interruptions of a light beam.

In the past, photoelectric systems utilizing light emitting and sensing devices for detecting interruptions of light beams have depended upon a variation in the total amount of light received by the sensing devices to detect the interruption of a light beam. When the light beam is broken, or the light transmission path between a light emitter and sensing device becomes sufficiently opaque, the sensing device will generate an indication of an interrupted light beam. The effects of external or ambient light on photoelectric systems also gives rise to a major disadvantage in that the amount of ambient light may be sufficient to cause the sensing device to respond at all times even in the absence of light generated by a light emitting device.

Improved types of photoelectric systems have been developed using light beams comprised of light pulse signals. Such signals utilize counters and logic circuitry to detect interruptions of the light beams. Some of these photoelectric systems have been designed to compensate for varying degrees of opaqueness of the light transmission path by manually adjusting controllers to preset the frequency and duration of transmitted light pulse signals for each transmission path environment. Other photoelectric systems utilizing beams of light pulse signals have been arranged to compensate for light transmission path variations by having a pulse stretcher circuit respond to each of various received light pulse signals. The pulse stretcher responds to each received light pulse signal by generating a signal of a fixed time duration to inhibit a detector from generating false path interruption signals. Another arrangement sometimes used by photoelectric systems has been to provide a biasing illumination source at the sensing device to improve the sensitivity of the sensing device with respect to received light pulse signals. A problem with these prior art photoelectric systems is that they are relatively complicated and require adjustment for each use in different transmission path environments.

Accordingly, a need exists in the art for a photoelectric system arranged to operate with a high degree of sensitivity over light transmission paths that may be subjected to a wide variety of light signal variations. A need also exists for a photoelectric system having relativelfy simplified apparatus capable of operating with a minimum of power and adjustment over a variety of transmission paths subject to short-term variations not constituting a transmission path interruption.

SUMMARY OF THE INVENTION

In the exemplary embodiment of the invention, a photoelectric system for detecting occurrence of interruptions of a light beam is arranged to compensate for non-interrupting short-term variations occurring in the light beam transmission path during transmission of the light beam. The embodied photoelectric system comprises apparatus arranged to emit a serial train of light pulse signals constituting a light beam. Sensing apparatus senses each of the emitted light pulse signals and enables other apparatus to control the light emitting apparatus to modulate the emitted light pulse signals to compensate for transmission path variations that do not constitute interruptions of the light beam.

In accordance with one feature of the invention, memory apparatus defining two states responds to clock pulse signals by assuming a first one of the states to control a light emitting generator to generate a light signal. Photoelectric sensor apparatus detects the generated light signal and enables the memory apparatus to compensate for short-term variations occurring in the light signal transmission path by resetting the memory apparatus to a second one of the states inhibiting emission of the light signal in accordance with the amount of illumination contained in the detected light signal.

In accordance with another feature of the invention, a photoelectric system comprises a memory element that responds to clock pulse signals by defining one of two states to control light emitting diode apparatus to generate a light signal. Apparatus comprising a capacitor connected in series with a photoelectric diode senses the amount of illumination contained in the emitted light signal and compensates for short-term variations occurring in the light signal transmission path by resetting the memory element to the other state to control modulation of the duty cycle of the emitted light signal. The apparatus further comprises circuitry that respond to the other state of the memory means by establishing a discharge path for a charge signal accumulated by the capacitor in response to the illumination contained in the sensed light signal.

In accordance with yet another feature of the invention, a photoelectric system for identifying interruptions of a serial train of light pulse signals generated by a memory element defining one of two states in response to clock pulse signals comprises apparatus enabled by one state of the memory element and by the transition between the states thereof occurring at successive ones of the clock pulse signals for deriving continuous and interrupted signals indicating respectively an uninterrupted and interrupted serial train of light pulse signals.

DESCRIPTION OF THE DRAWING

The foregoing objectives and advantages, as well as others of the invention, will be more apparent upon consideration of the accompanying drawing wherein.

Figure 1:
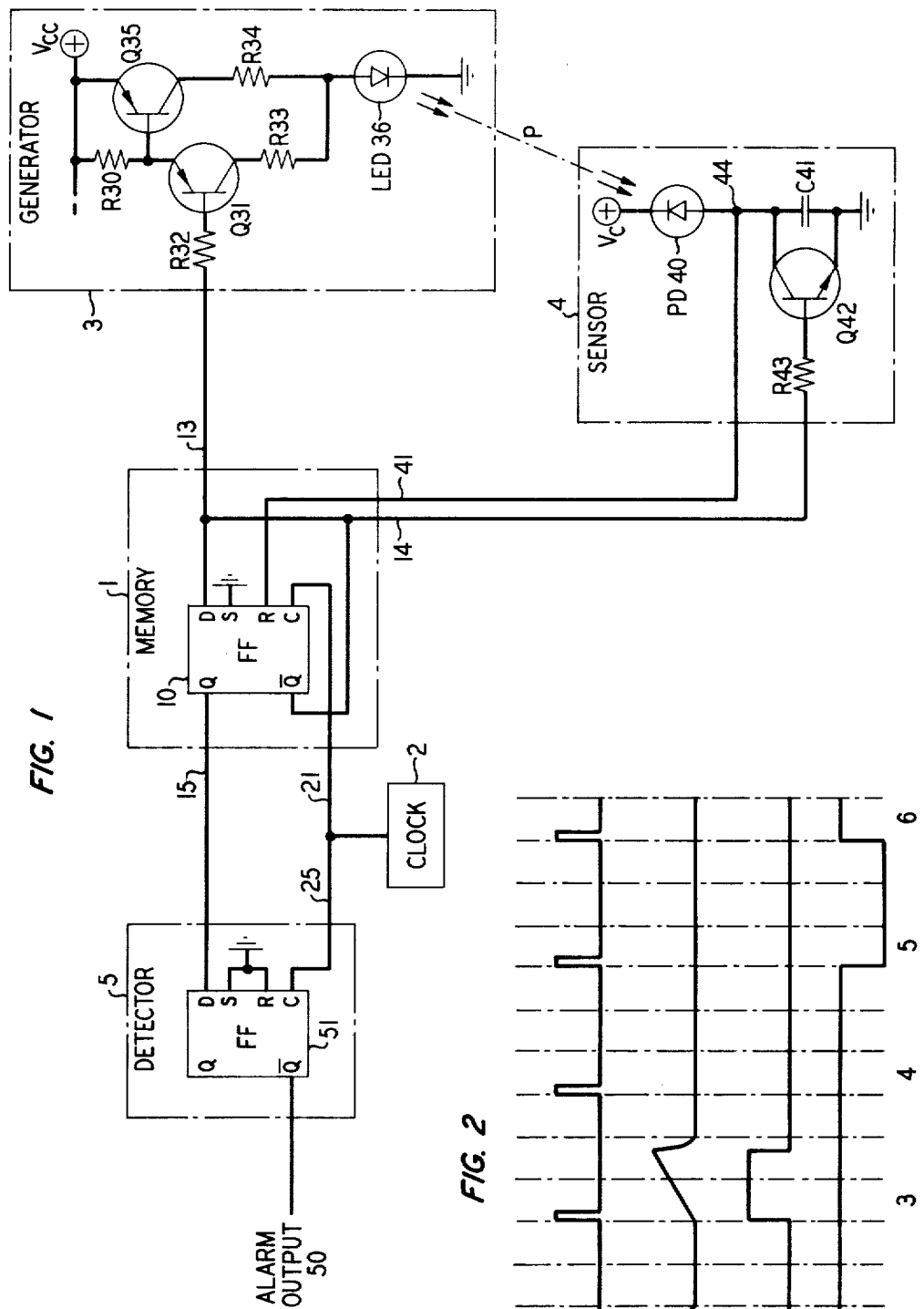
FIG. 1 sets forth the schematic details of a photoelectric system embodying the principles of the instant invention.

The detailed circuitry of clock and bi-stable elements 2, 10, and 51 discussed below are well-known in the art and are similar to logic circuitry described by J. Millman and H. Taub in the textbook *Pulse, Digital and Switching Waveforms*, 1965, McGraw-Hill Incorporated.

DESCRIPTION

1. General

Referring now to the drawing, memory 1 and detector 5 comprises bi-stable logic circuits 10, 51 arranged to exist indefinitely in either of two stable states and which can be induced by external excitation to make an abrupt transition from one state to the other. Each bi-stable logic circuit 10, 51 has two output terminals designated Q and $\overline{Q}$ and is arranged to define a set, or first, state wherein Q assumes a voltage $V_{cc}$ and $\overline{Q}$ assumes ground, herein designated a logical 1 and 0, respectively. When memory 1 or detector 5 is reset to the reset, or second, state, terminal Q assumes a logical 0 corresponding to ground and terminal $\overline{Q}$ assumes a logical 1 corresponding to voltage $V_{cc}$. In addition to output terminals Q and $\overline{Q}$ there are provided a set terminal S connected to ground and a reset terminal R. Reset terminal R of memory 1 responds to a predetermined value of voltage appearing thereon by resetting memory 1 to the second state.

Bi-stable logic circuits 10 and 51 are a well-known type of memory element oftentimes, and hereinafter, referred to as a D-type of flip-flop. Flip-flops 10 and 51 also include a clock terminal C and an input terminal D and respond to a clock pulse signal applied to clock terminal C by enabling output terminal Q of the flip-flop to define the logical value appearing on input terminal D at the time of occurrence of the clock pulse signal. Memory 1 is arranged so that output terminal $\overline{Q}$ of flip-flop 10 is connected to input terminal D. Thus, when flip-flop 10 is set to the first state, the logical 0 appearing on output terminal $\overline{Q}$ is applied to input terminal D and an incoming clock pulse signal in combination with the logical 0 on input terminal D resets flip-flop 10 to the second state thereby causing output terminal Q to assume a logical 0 and output terminal $\overline{Q}$ a logical 1. The following clock pulse signal sets flip-flop 10 to the first state so that output terminal Q then defines a logical 1 which priorly appeared at input terminal D at the time of occurrence of the clock pulse signal.

2. Generation of a Light Beam

Figure 2:
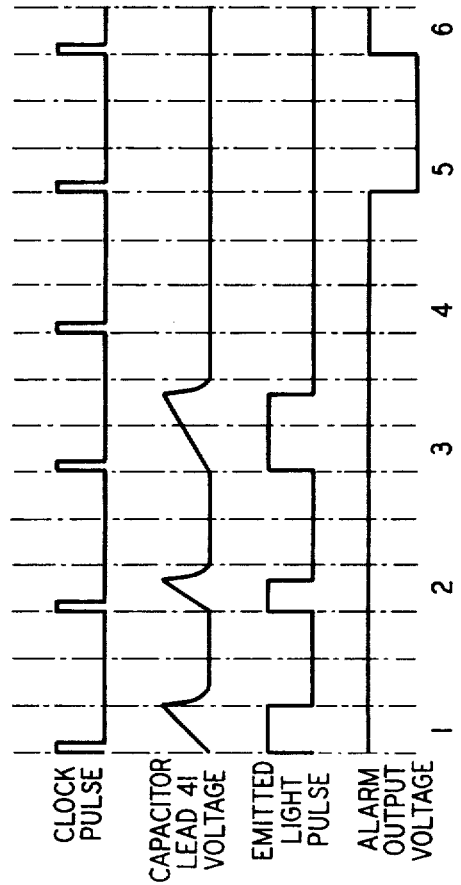
FIG. 2 depicts waveforms of the photoelectric system.

Clock 2, in the well-known manner, generates a succession of clock pulse signals having the clock pulse waveform set forth in FIG. 2 of the drawing and applies each clock pulse signal to memory 1. An incoming clock pulse signal sets memory 1 to the first state thereby causing output terminals Q and $\overline{Q}$ to assume a logical 1 and 0, respectively. The resultant ground appearing on lead 13 connected to memory 1 output terminal $\overline{Q}$ is applied, via resistor R32, to the base of transistor Q31 located in generator 3. Transistor Q31 is thereby forward biased and enables current to flow from voltage $V_{cc}$ through resistor R30, the emitter-collector circuit of transistor Q31, resistor R33, and light emitting diode LED 36 to ground. The voltage drop appearing across resistor R30 forward biases transistor Q35 to enable current to flow from voltage $V_{cc}$ to ground over a path extending through the emitter-collector circuit of transistor Q35, resistor R34, and light emitting diode LED 36.

Light emitting diode LED 36 may be one of a number of different types of solid state light emitting diodes well-known in the art that emit a light signal in response to the flow of current applied thereto. The forward biasing and high gain characteristics of transistors Q31 and Q35 enable light emitting diode LED 36 to emit a light signal over a light signal transmission path P extending from generator 3 to sensor 4.

3. Detection of Emitted Light Signals

Light signals emitted by generator 3 and transmitted over light signal transmission path P are detected by sensor 4. Sensor 4 apparatus comprises a photoelectric diode PD40 connected in series with capacitor C41 between voltage source $V_c$ and ground. The collector-emitter circuit of a transistor Q42, having a base circuit coupled through resistor R43 over lead 14 to memory 1 output terminal $\overline{Q}$, is connected across capacitor C41. The junction point 44 between photoelectric diode PD40, capacitor C41, and the collector of transistor Q42, is connected over feedback lead 41 to reset terminal R of memory 1.

Photoelectric diode PD40 may be any one of a number of well-known types of photoelectric diodes capable of exhibiting a reverse resistance that decreases in response to an applied light signal. The amount of illumination contained in the light signal emitted by generator 3 and sensed by sensor 4 determines the value of the reverse resistance of photoelectric diode PD40. In the absence of a light signal photoelectric diode PD40 permits little current to flow to establish a charge on capacitor C41. Upon detecting the emitted light signal, the reverse resistance of photoelectric diode PD40 decreases in relationship to the amount of illumination contained in the sensed light signal to thereby establish an obvious charge path for capacitor C41. Recalling that memory 1 was set to the first state, the logical 0 appearing on output terminal $\overline{Q}$ maintains ground on lead 14 to reverse bias transistor Q42 to the cutoff state thereby allowing capacitor C41 to charge. Capacitor C41 charges at a rate in response to the amount of illumination contained in the sensed light signal in accordance with the capacitor C41 voltage waveform set forth in FIG. 2 of the drawing. After a charge interval determined by the amount of illumination in the sensed light signal the voltage appearing across capacitor C41 increases to a predetermined value sufficient to reset memory 1 to the second state over feedback lead 41.

The resulting value of voltage $V_{cc}$ appearing at the output terminal $\overline{Q}$ of reset memory 1 is applied over lead 13 to reverse bias transistor Q31 of generator 3. The resultant cutoff of Q31 reverse biases transistor Q35 to interrupt the flow of current through light emitting diode LED 36 and thereby extinguish the emitted light signal. In addition to enabling generator 3 to extinguish the light signal, the voltage $V_{cc}$ also appearing on lead 14 forward biases transistor Q42 of sensor 4 to establish a discharge path through the transistor collector-emitter circuit for the charge accumulated on capacitor C41/

With memory 1 reset to the second state a logical 1 is applied to input terminal D of flip-flop 10 from the output terminal $\overline{Q}$. The next clock pulse signal from clock 2 in combination with the logical 1 appearing on input terminal D sets memory 1 to the first state to re-initiate the generation of another light signal. Barring an interruption of light signal transmission path P, each clock pulse signal sets memory 1 to the first state to initiate the emission of a light signal that is subsequently extinguished by resetting memory 1 to the second state prior to occurrence of the next clock pulse signal. The result is a serial train of light pulse signals that constitute a light beam extending between generator 3 and sensor 4 and which are represented as the emitted light pulse waveform set forth in FIG. 2 of the drawing.

The disclosed photoelectric system is able to compensate for short-term variations that occur in light signal transmission path P by controlling generator 3 to modulate the width of the emitted light pulse signals. When the environment of light signal transmission path P is subjected to a high ambient light condition the reverse resistance of photoelectric diode PD40 decreases. Thus, as shown at interval 2 of capacitor C41 voltage waveform in FIG. 2 of the drawing, capacitor C41 charges at a faster rate and memory element 1 is quickly reset to the second state to compensate for the increased amount of ambient light by decreasing the width of the emitted light pulse signal. Should the amount of illumination in the detected light pulse signal decrease, the reverse resistance of photoelectric diode PD40 will increase. As set forth by interval $f_3$ of capacitor C41 voltage waveform, FIG. 2 of the drawing, capacitor C41 charges at a slower rate to reset memory 1 thereby increasing the pulse width of the emitted light pulse signal as shown by the emitted light pulse wave. Thus, the present photoelectric system compensates for short-term variations that may occur in light signal transmission paths by controlling memory 1 over a feedback path to modulate each emitted light pulse signal to compensate for the transmission path variations.

The present photoelectric system in addition to compensating for transmission path variations is not nearly as sensitive to the presence of ambient light in the transmission path environment. Capacitor C41 only charges during the short time interval that generator 3 is emitting a light pulse signal, and due to the low duty cycle of the light pulse signal, the illumination of the emitted light pulse signal is many times that of the ambient light level. The system consumes very little power when generator 3 is turned off and the emitted light pulse signal duty cycle is sufficiently short so that the average power consumption of this system is well below that of conventional photoelectric systems.

4. Interruption of the Light Beam

Detector 5 is provided to identify interruptions occurring in the serial train of light pulse signals constituting the light beam emitted from generator 3. When light signal transmission path P is interrupted for a period of time greater than the time interval between successive clock pulse signals generated by clock 2, detector 5 indicates the interruption by deriving an interrupted signal on alarm output lead 50.

The apparatus of detector 5 comprises a D-type of flip-flop 51 identical to flip-flop 10 of memory element 1. The D and C terminals of flip-flop 51 are connected respectively, via leads 15 and 25, to the Q output terminal of memory 1 and the output of clock 2. When the light signal transmission path P is uninterrupted, detector 5 is maintained in the reset, or second state, so that the logical 1 appearing on output terminal $\overline{Q}$ thereof appears as a continuous voltage $V_{cc}$ on alarm output lead 50.

A clock pulse signal initially sets memory 1 to the first state to enable generator 3 to emit a light signal. After detecting the illumination of the emitted light signal received over light signal transmission path P, sensor 4 resets memory 1 to the second state thereby placing a logical 0 on lead 15 extending to detector 5 and the D input of flip-flop 51. The succeeding clock pulse signal, in combination with the logical 1 and 0 appearing on the input D terminals of flip-flop 10 and 51, respectively, again sets memory 1 to the first state to initiate emission of another light signal and maintains detector 5 in the reset, or second state. As long as the light beams remain uninterrupted, memory 1 is always reset to the second state prior to the next clock pulse signal. The next clock pulse signal, in combination with the logical 0 now appearing on lead 15, maintains detector 5 in the reset state so that alarm output voltage $V_{cc}$ continuously appears on alarm output lead 50 as set forth in FIG. 2 of the drawing as long as light signal transmission path P remains uninterrupted.

When the light beam is interrupted, sensor 4 fails to reset memory 1 which then continues to remain in the first state to apply a logical 1 over lead 15 to detector 5 and the input terminal D of flip-flop 51. A transition of states occurred in that memory 1 was previously reset to the second state prior to occurrence of the last pulse signal. The next clock pulse signal, in combination with a logical 0 and 1 appearing on the input terminal D of memory 1 and lead 15, respectively, sets memory 1 to the second state to extinguish the light signal and sets detector 5 to the first state. Setting detector 5 to the first state causes a logical 0, or ground, to appear on alarm output lead 50 as an indication of the interruption of the light beam.

Should the interruption continue, the following clock pulse signal occurring when memory 1 is reset to the second state sets memory 1 to the first state and resets detector 5 to the second state. The setting and resetting of memory 1 and detector 5, caused by the transition of states of memory 1 occurring at successive ones of the clock pulse signals, enables detector 5 to derive an interrupted signal on alarm lead 50 indicating an interruption of light signal transmission path P.

In the event light signal transmission path P is restored to the uninterrupted state, the photoelectric system will restore to normal operation. If, for example, memory 1 has been set by a clock pulse signal to the first state, the restoral of light signal transmission path P to the uninterrupted state enables sensor 4 to respond to the emitted light signal by resetting memory 1 to re-initialize the photoelectric system. When light signal transmission path P is restored to the uninterrupted state during the time interval memory 1 is reset to the second state, the following clock pulse signal sets memory 1 to the first state to again reinitialize the photoelectric system. In both instances, detector 5 is reset to the second state to reapply voltage $V_{cc}$ to alarm output lead 50 as an indication that light signal transmission path P has been restored.

SUMMARY

It is obvious from the foregoing that the facility, economy, and efficiency of photoelectric systems may be substantially enhanced by the provision of apparatus arranged to compensate for short-term variations occurring in the transmission of light signals. It is further obvious that the present photoelectric system's unique arrangement for compensating for light signal transmission path variations enables the photoelectric system to be used in applications requiring low power and subjected to varying ambient light environments.

While the apparatus of the invention has been disclosed in a specific photoelectric system arrangement, it is to be understood that such an embodiment is intended to be illustrative of the principles of the invention and that numerous other arrangements may be devices by those skilled in the art without departing from the spirit and scope of the invention.

What is claimed is:

1. A photoelectric system for detecting interruptions of a light beam comprising
    means for emitting a serial train of light pulse signals constituting the light beam,
    means for sensing each one of the emitted light pulse signals, and
    means enabled by said sensing means for controlling said emitting means to modulate the duty cycle pulse width of the emitted light pulse signals to compensate for transmission variations not constituting an interruption of the light beam.

2. The photoelectric system set forth in claim 1 wherein said emitting means comprises a light emitting diode, means for generating clock pulse signals, means having two states and responsive to said generating means for defining ones of the states in accordance with the state defined at time of occurrence of each of the clock pulse signals, and means connected to said defining means and responsive to a first one of the states thereof for enabling said light emitting diode to generate a light signal.

3. The photoelectric system set forth in claim 2 wherein said sensing means comprises a photoelectric diode for detecting the generated light signals said photoelectric diode having a reverse value of resistance dependent upon the amount of illumination contained in the generated light signal.

4. The photoelectric system set forth in claim 3 wherein said controlling means comprises a capacitor connected in series with said photoelectric diode, means connected across said capacitor and responsive to a second one of the states of said defining means for establishing a discharge path for said capacitor, and means enabled by said capacitor in response to the amount of illumination contained in the detected light signal for selectively resetting said defining means to the second state to inhibit said enabling means from further generating the light signal.

5. The photoelectric system set forth in claim 4 further comprising means enabled by the second state of said defining means and by the transition between states thereof occurring at successive ones of the clock pulse signals for deriving continuous and interrupted signals indicating respectively an uninterrupted and interrupted light beam.

6. A photoelectric system for detecting interruptions of a light beam comprising means including a memory element and a clock pulse generator for emitting a serial train of light pulse signals constituting the light beam in response to clock pulse signals, means for sensing each of the emitted light pulse signals, and means responsive to the amount of illumination contained in each sensed emitted light pulse signal for controlling said memory element to modulate the duty cycle pulse width of the sensed emitted light pulse signal to compensate for short-term transmission path variations not constituting a light beam interruption.

7. A photoelectric system comprising a clock circuit for generating clock pulse signals, a memory element having two states and connected to said clock circuit for defining ones of the two states in accordance with the state defined at the time of occurrence of each of the clock pulse signals, a light emitting generator connected to said memory element and enabled by a first one of the states thereof for generating a light signal, a photoelectric sensor for detecting the generated light signal, a detector enabled by the first state of said memory and by the transition of of the states thereof occurring at successive ones of the clock pulse signals for deriving output signals indicating uninterruption and interruption of a light signal transmission path beween said light emitting generator and said photoelectric sensor, and means connected to said photoelectric sensor and said memory element for compensating for short-term variations occurring in the light signal transmission path by resetting said memory element to a second one of the states to modulate the duty cycle pulse width of the generated light signal in accordance with the amount of illumination contained in the detected light signal.

8. A photoelectric system for detecting interruptions of a light beam comprising means including a memory element and a source of clock pulse signals for emitting a serial train of light pulse signals constituting the light beam, said memory element having a clock terminal to which said clock source is connected and a reset terminal, means for sensing each one of the emitted light pulse signals, and means connecting said sensing means to said reset terminal for controlling said emitting means to modulate the duty cycle pulse width of the emitted light pulse signals to compensate for transmission variations not constituting an interruption of the light beam.

9. The photoelectric system set forth in claim 8 further comprising a detector for generating an interrupted alarm output signal during each interruption of the light beam, said detector comprising a bit-stable logic element having an input terminal connected to said memory element and a clock terminal connected to said clock source.

* * * * *